United States Patent
Zang et al.

(10) Patent No.: US 9,576,856 B2
(45) Date of Patent: Feb. 21, 2017

(54) FABRICATION OF NANOWIRE FIELD EFFECT TRANSISTOR STRUCTURES

(71) Applicant: GLOBALFOUNDRIES Inc., Grand Cayman (KY)

(72) Inventors: Hui Zang, Guilderland, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 24 days.

(21) Appl. No.: 14/524,628

(22) Filed: Oct. 27, 2014

(65) Prior Publication Data

US 2016/0118304 A1   Apr. 28, 2016

(51) Int. Cl.
*H01L 21/311* (2006.01)
*H01L 21/8238* (2006.01)

(52) U.S. Cl.
CPC .............. *H01L 21/823807* (2013.01)

(58) Field of Classification Search
CPC .............. H01L 29/0665; H01L 21/823807; H01L 21/3085; H01L 29/0673; H01L 29/1033; H01L 29/413; H01L 29/41775; H01L 29/66439; H01L 29/66477; H01L 29/775
USPC ......................................................... 438/694
See application file for complete search history.

(56) References Cited

U.S. PATENT DOCUMENTS

| | | | |
|---|---|---|---|
| 5,580,802 A | 12/1996 | Mayer et al. | |
| 6,391,782 B1 | 5/2002 | Yu | |
| 8,338,280 B2 | 12/2012 | Tan et al. | |
| 8,384,065 B2 | 2/2013 | Bangsaruntip et al. | |
| 2005/0003592 A1 | 1/2005 | Jones | |
| 2011/0070734 A1* | 3/2011 | Saracco ................. | B82Y 10/00 438/689 |
| 2013/0302955 A1* | 11/2013 | Vinet ..................... | B82Y 10/00 438/197 |
| 2014/0285980 A1* | 9/2014 | Cappellani ............. | H01L 21/76 361/748 |

OTHER PUBLICATIONS

Windl, W. et al., "Characterization and Modeling of Atomically Sharp "Perfect" Si:Ge/SiO2 Interfaces", ECS Transactions, vol. 3, No. 7, pp. 539-549 (2006).

(Continued)

*Primary Examiner* — Duy T Nguyen
(74) *Attorney, Agent, or Firm* — Heslin Rothenberg Farley & Mesiti P.C.; Nathan B. Davis (57) ABSTRACT

Methods are presented for facilitating fabrication of nanowire structures, such as one or more nanowire field effect transistors. The methods include, for instance: providing a substrate; providing first material layers and second material layers above the substrate, the first material layers interleaved with the second material layers; removing portions of the first material layers and second material layers, the removing forming a plurality of nanowire stacks, including first material nanowires and second material nanowires; removing the first material nanowires from at least one nanowire stack; and removing the second material nanowires from at least one other nanowire stack, where the at least one nanowire stack and at least one other nanowire stack include a p-type nanowire stack(s) and a n-type nanowire stack(s), respectively.

17 Claims, 8 Drawing Sheets

(56) References Cited

OTHER PUBLICATIONS

Dupre, C. et al., "15nm-Diameter 3D Stacked Nanowires with Independent Gates Operation: ΦFET", Electron Devices Meeting, IEEE International, San Francisco, CA, Dec. 15-17, 2008 (4 pages).
Nakaharai, S. et al., "Formation Process of High-Purity Ge-On-Insulator Layers by Ge-Condensation Technique", Journal of Applied Physics, vol. 105, 024515 (2009) (8 pages).
Park et al., "New Graded Ge Condensation Method for Formation of Ge-on-Insulator Layer", Journal of the Korean Physical Society, vol. 51, No. 3, Sep. 2007, pp. 1100-1104 (5 pages).
Liu et al., "Facilitating Fabricating Gate-All-Around Nanowire Field-Effect Transistors",U.S. Appl. No. 14/050,494, filed Oct. 10, 2013, 30 pages.

* cited by examiner

FABRICATION OF NANOWIRE FIELD EFFECT TRANSISTOR STRUCTURES

FIELD OF THE INVENTION

The present invention relates to integrated circuits and to methods of manufacturing integrated circuits, and more particularly, to methods for facilitating fabrication of nanowire structures, such as one or more nanowire field effect transistor (FET) structures.

BACKGROUND OF THE INVENTION

Complementary metal oxide semiconductor (CMOS) technology is the primary technology employed for ultra-large scale integrated (ULSI) circuits. Over the past decades, reduction in the size of CMOS transistors, such as metal oxide semiconductor field-effect transistors (MOSFETs), has been a principle focus of the microelectronics industry. As transistors become smaller, the body thickness of the transistor (or thickness of the depletion layer below the inversion channel) must be scaled down to achieve superior short-channel performance.

In practice, the geometry of the gate and channel can become quite complicated. In one class of the device, a gate may be placed beneath the channel, as well as on top of the channel and its sides, to define a gate-all-around device, such as a gate-all-around MOSFET device. The gate-all-around configuration advantageously significantly increases the extent of the inversion layer. One type of gate-all-around device includes nanowire structures, in which one or more nanowires define the channel or channels of the FET and the gate is structured to wrap around each of the nanowires. However, fabrication of nanowire structures is challenging, and integration of nanowire fabrication techniques into integrated circuit fabrication processes continues to pose several difficulties.

BRIEF SUMMARY

Various shortcomings of the prior art are overcome, and additional advantages are provided through the provision, in one aspect, of a method which includes: providing a substrate; providing first material layers and second material layers above the substrate, the first material layers interleaved with the second material layers; removing portions of the first material layers and second material layers, the removing forming a plurality of nanowire stacks that include first material nanowires and second material nanowires; removing the first material nanowires from at least one nanowire stack; removing the second material nanowires from at least one other nanowire stack; wherein the at least one nanowire stack and at least one other nanowire stack include at least one p-type nanowire stack and at least one n-type nanowire stack, respectively.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Disclosed herein, at least in part, are methods of fabricating nanowire structures, such as one or more nanowire field effect transistor structures. As used herein, a nanowire is an elongate nanostructure with, for instance, a diameter or thickness on the order of a few nanometers or less. Alternatively, a nanowire can be defined as an elongate structure having a thickness or diameter constrained to, for instance, ten nanometers or less, and an unconstrained length. By way of example, semiconductor devices are discussed herein using semiconducting nanowires. In one embodiment, the nanowires may be incorporated into transistors, such as metal oxide semiconductor field-effect transistors (MOSFETs). Advantageously, the processes disclosed herein may be compatible with complementary metal oxide semiconductor (CMOS) processing.

The nanowire field-effect transistor with a gate-all-around structure is of significant interest in the semiconductor fabrication industry due to, for example, its excellent gate controllability on the channel and minimized short channel effect. However, fabrication of a nanowire structure can be challenging, and fabrication of multiple nanowire FETs with varying electrical and physical properties may be especially difficult. For example, forming a complete MOSFET transistor with both pFET and nFET nanowire structures may be difficult due to the different requirements for pFET structures versus nFET structures. pFET structures may require channel materials and structures designed to enhance hole mobility through the FET channel, while nFET structures may require different, separate materials and structures to enhance electron mobility through the FET channel.

Thus, generally stated, disclosed herein is a method including: providing a substrate; providing first material layers and second material layers above the substrate, the first material layers interleaved with the second material layers; removing portions of the first material layers and second material layers, the removing forming a plurality of nanowire stacks that include first material nanowires and second material nanowires; removing the first material nanowires from at least one nanowire stack; and removing the second material nanowires from at least one other nanowire stack, where the at least one nanowire stack and at least one other nanowire stack include at least a p-type nanowire stack and at least a n-type nanowire stack, respectively.

Reference is made below to the drawings, which are not drawn to scale for ease of understanding, wherein the same reference numbers used throughout different figures designate the same or similar components.

Figure 1A:
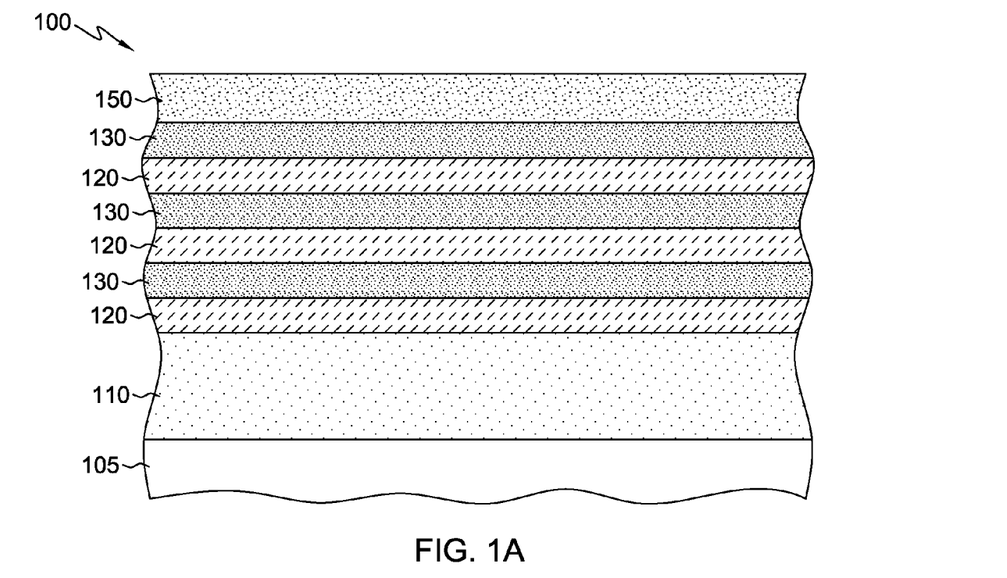
FIGS. 1A-1O depict one embodiment of a method of fabricating nanowire structures, in accordance with one or more aspects of the present invention.
Figure 1B:
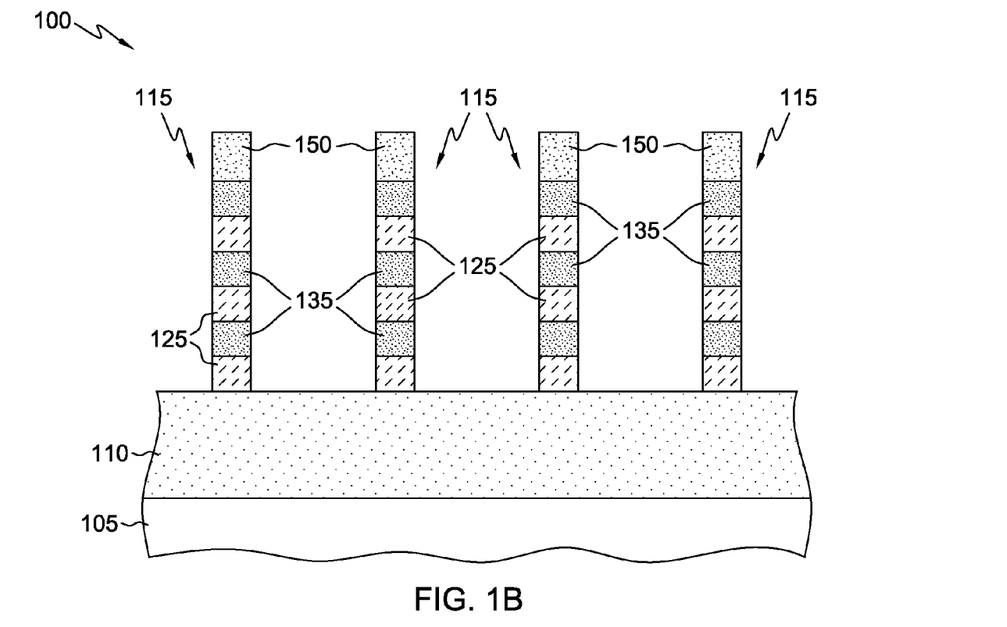
Figure 1C:
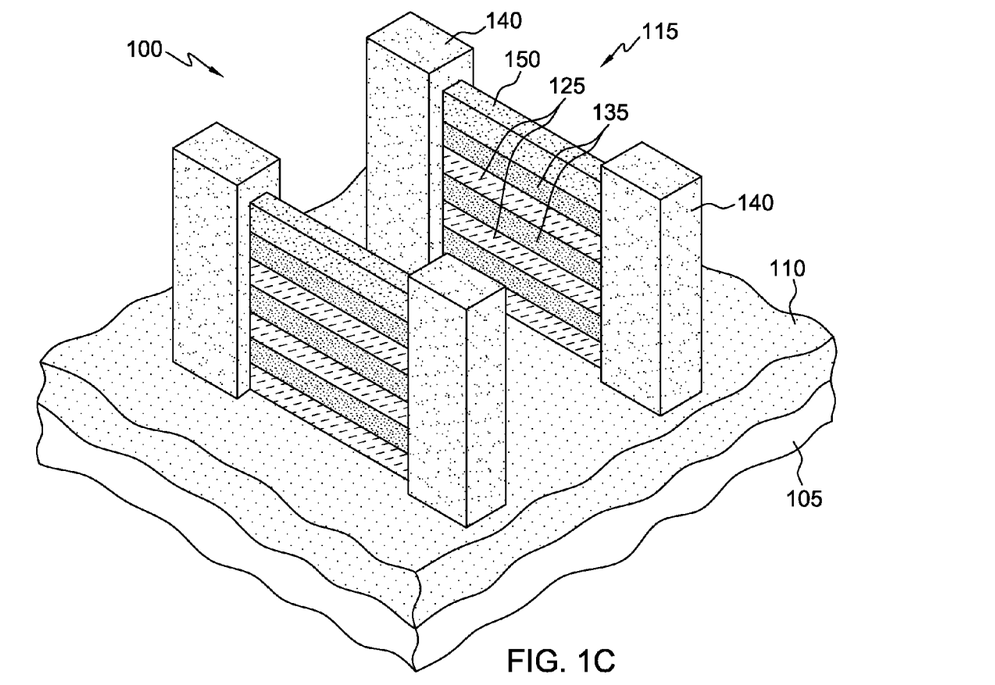
Figure 1D:
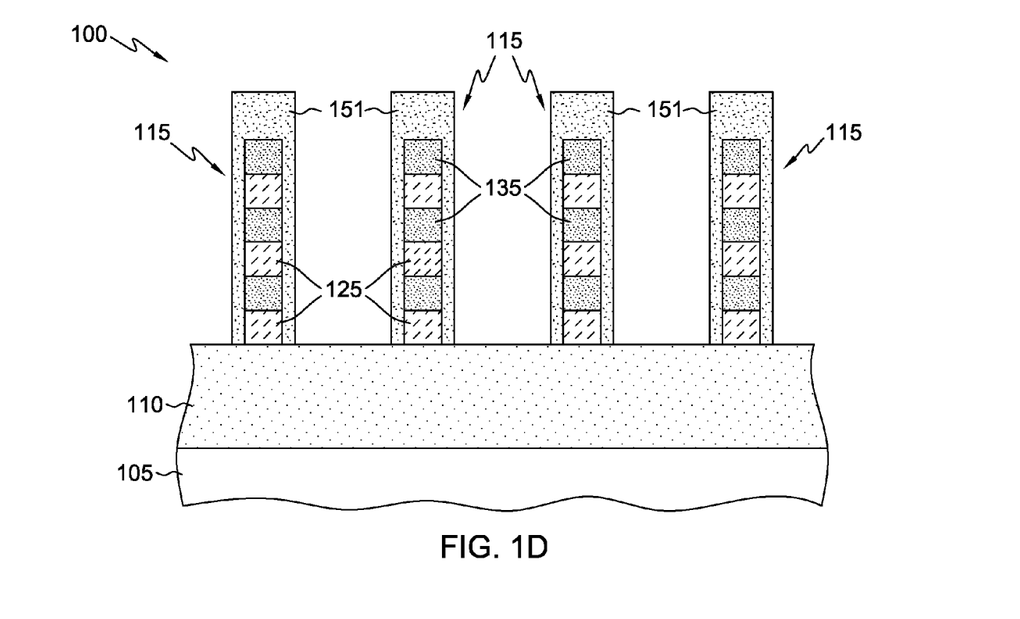
Figure 1E:
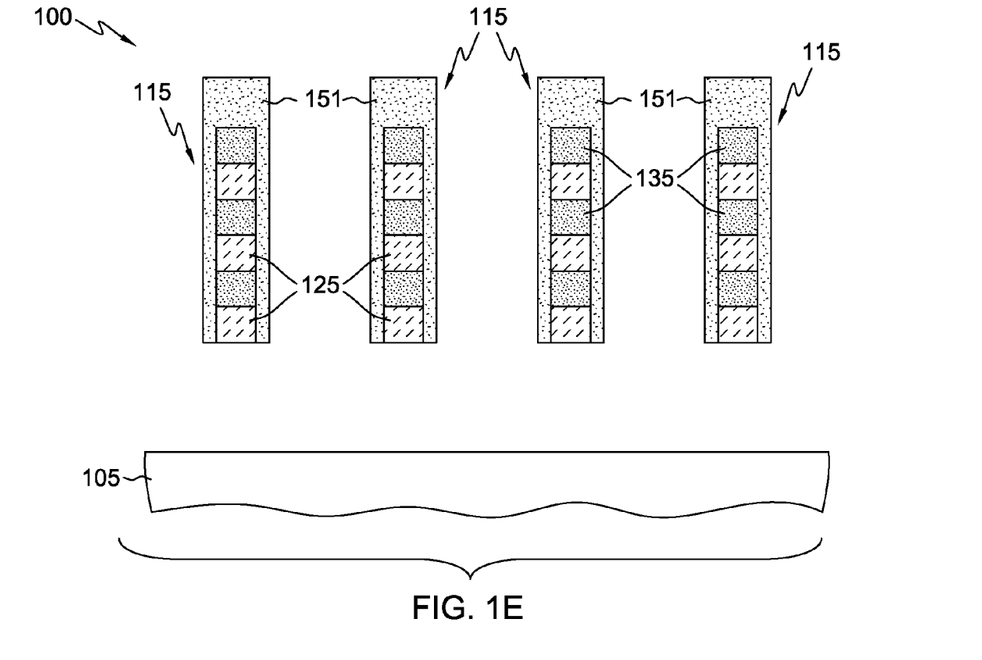
Figure 1F:
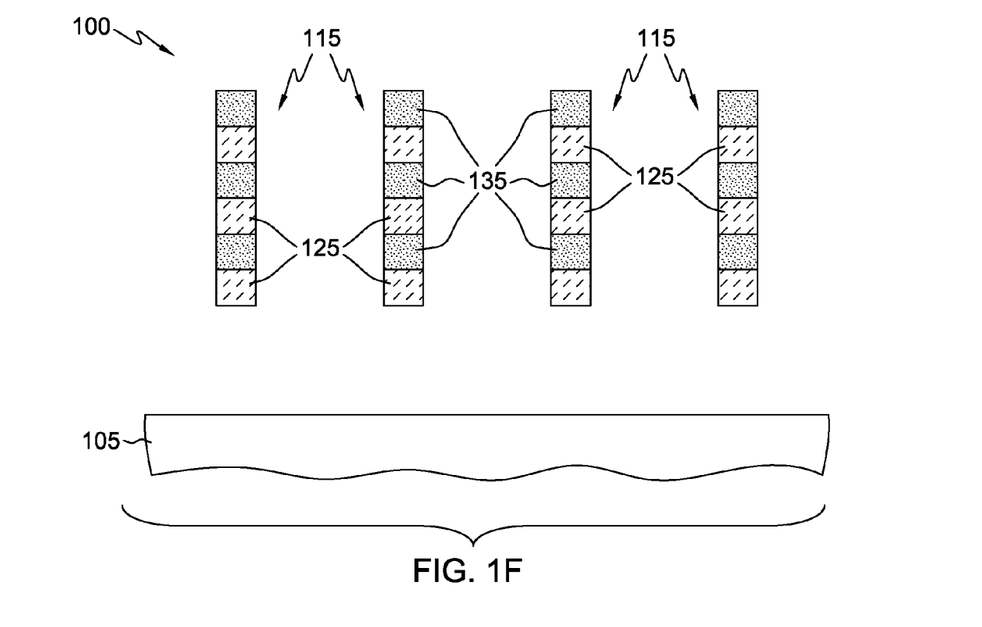
Figure 1G:
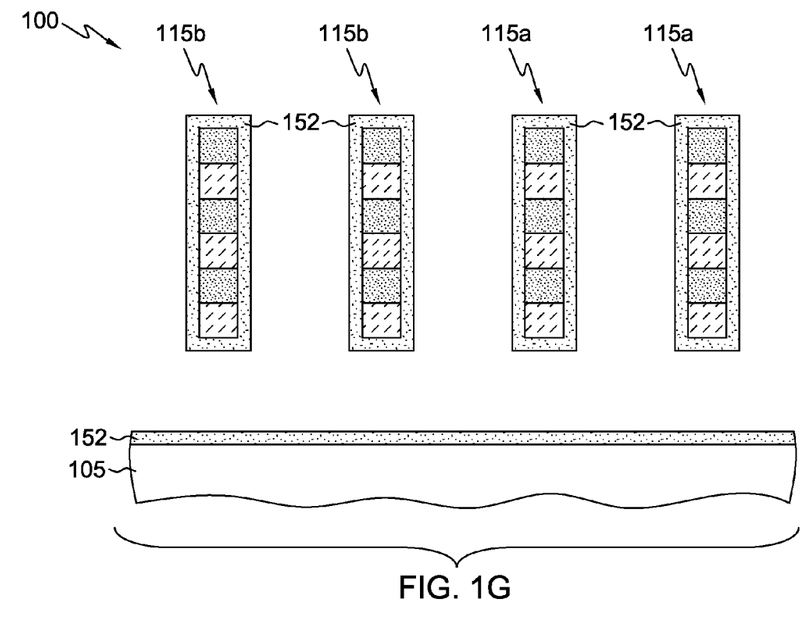
Figure 1H:
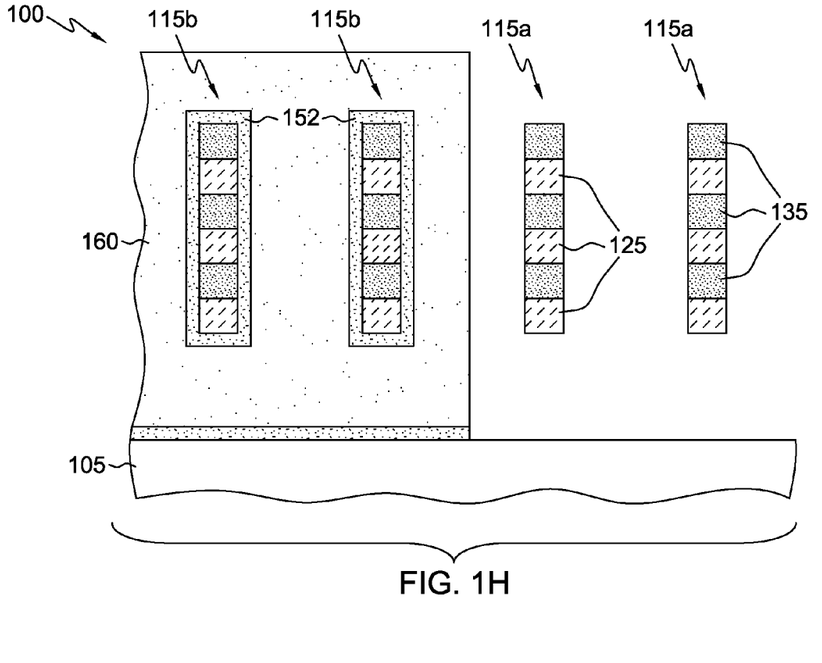
Figure 1I:
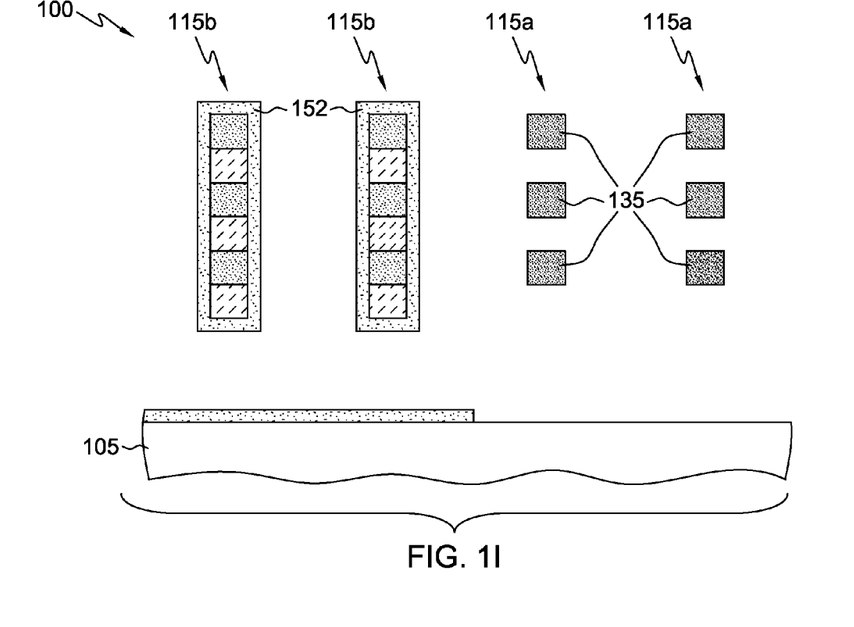
Figure 1J:
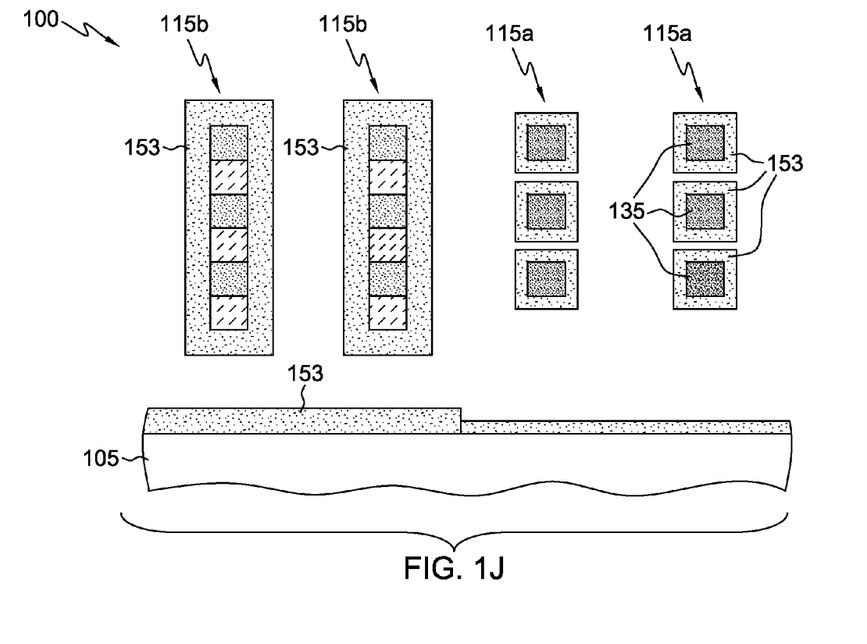
Figure 1K:
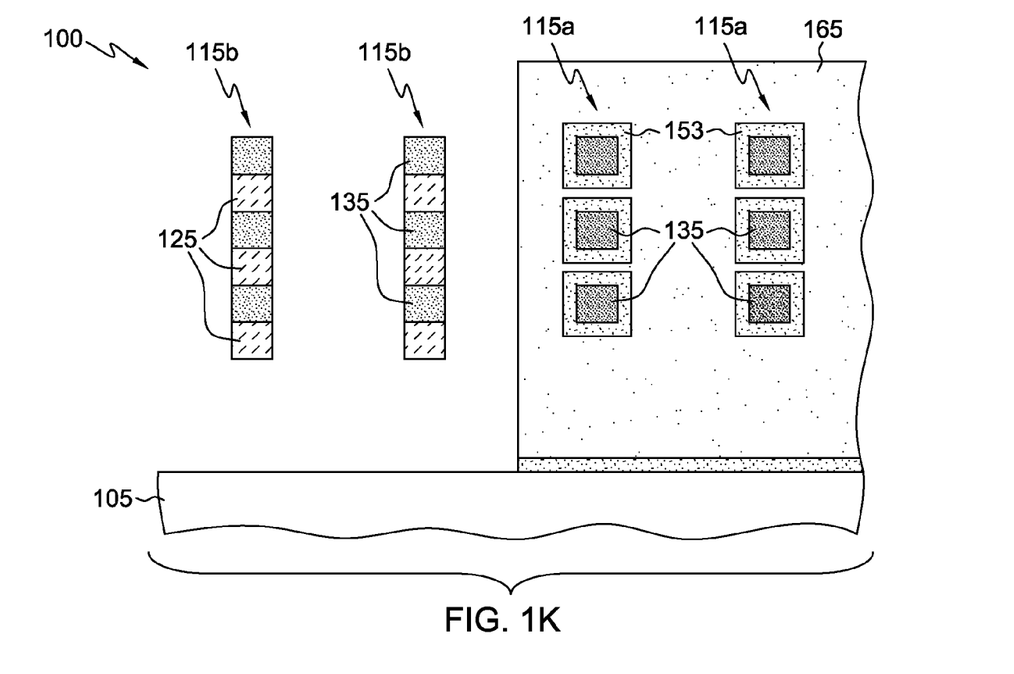
Figure 1L:
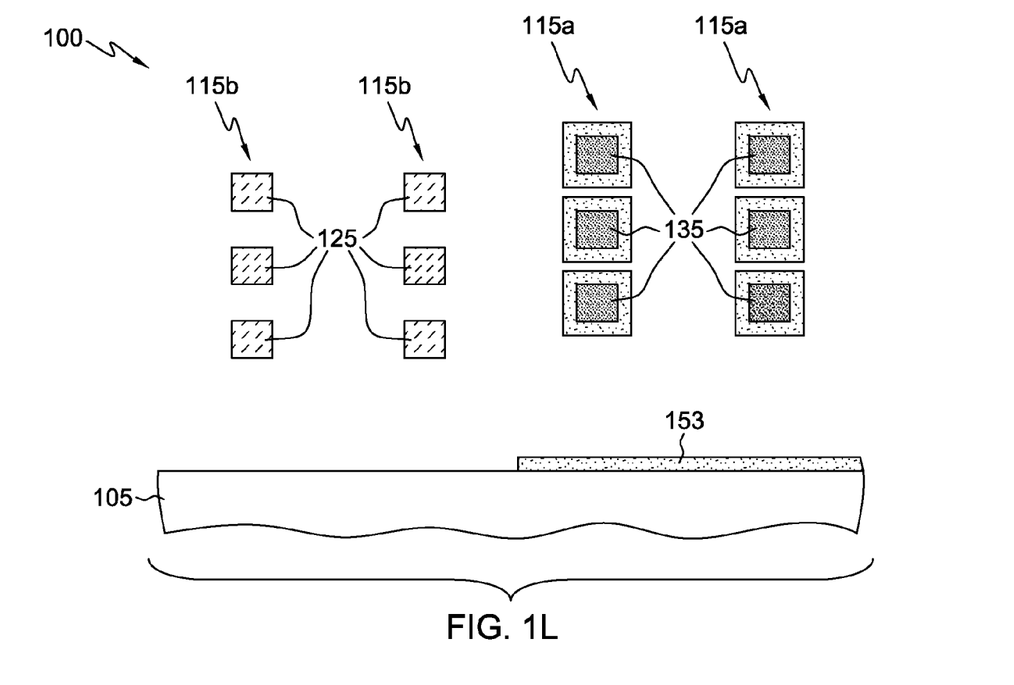
Figure 1M:
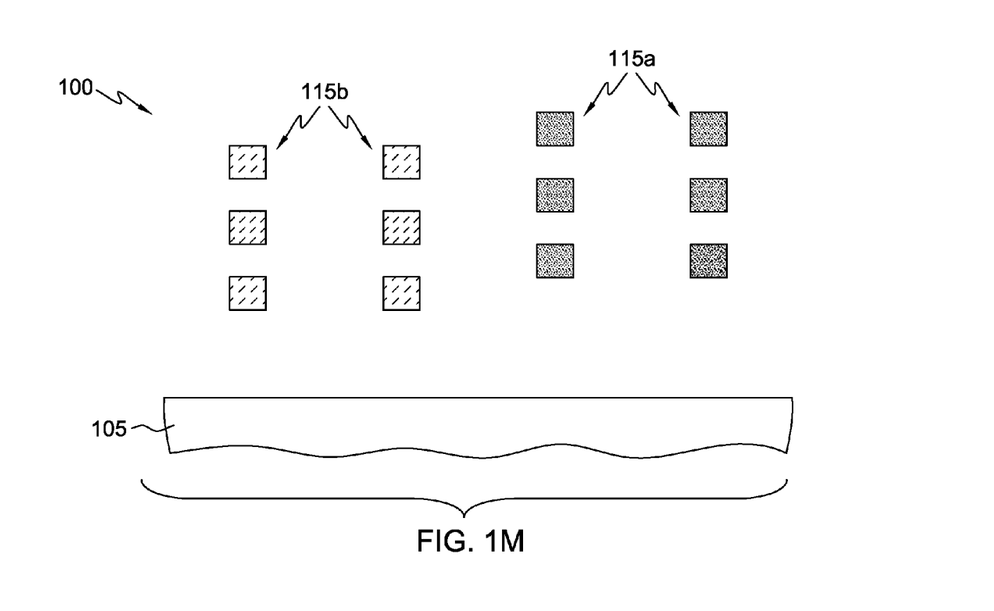
Figure 1N:
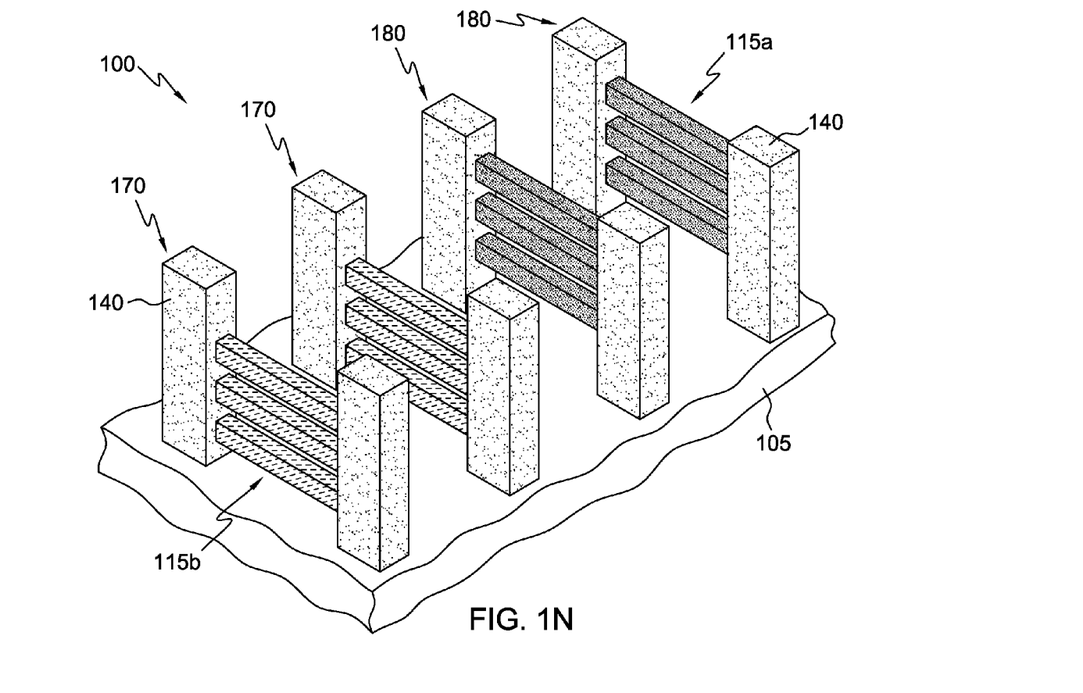
Figure 1O:
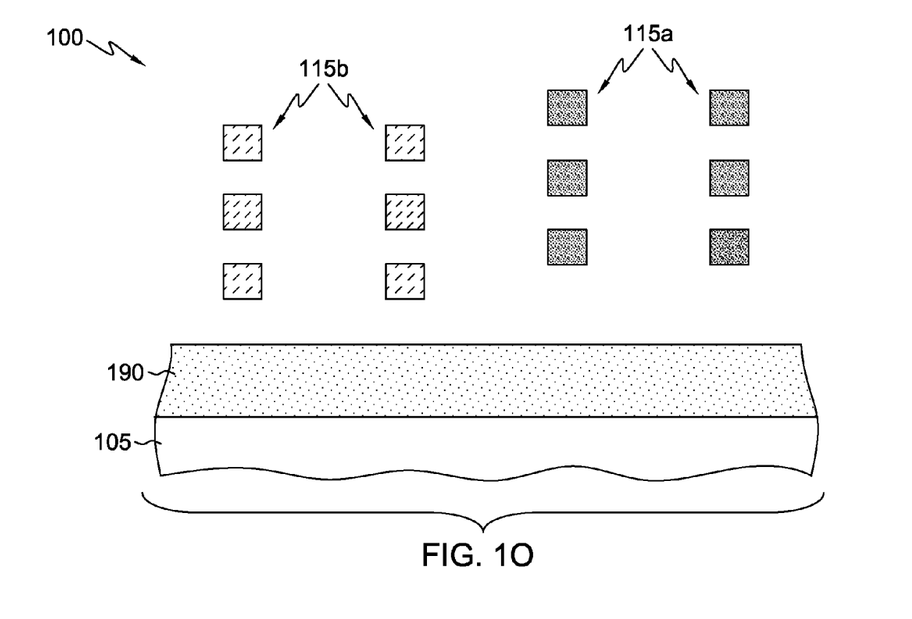

FIGS. 1A-1O depict one embodiment of a process for fabricating a circuit structure having nanowire structures, in accordance with one or more aspects of the present invention. Referring to FIG. 1A and structure 100 illustrated, the depicted process includes providing a substrate 105 and a plurality of first material layers 120 and second material layers 130 above the substrate, the first material layers 120 being interleaved with second material layers 130. By way of example only, FIG. 1A and subsequent figures depict three first material layers 120 and three second material layers 130. It will be appreciated that alternative embodiments may include two first material layers 120 and two second material layers 130, four first material layers 120 and four second material layers 130, or another number of first material layers and second material layers depending on the number of resulting nanowires desired in each resulting nanowire structure. By way of example, substrate 105 may be a bulk semiconductor material, for instance, a bulk silicon wafer. In exemplary embodiments, first material layers 120 have a first lattice constant and second material layers 130 have a second lattice constant, with the second lattice constant being higher than the first lattice constant. For example, first material layers 120 may be silicon layers and second material layers 130 may be silicon-germanium layers, which may be expressed as $Si_{1-x}Ge_x$ wherein x, the atomic ratio of germanium to silicon, may be less than or substantially equal to about 1, although the atomic ratio is about 0.3 to about 0.7 in one example. In exemplary embodiments, the second lattice constant being higher than the first lattice constant induces a strain in at least first material layers 120. A strain may also be induced in second material layers 130. For example, silicon layers 120 may have a strain induced when interleaved with silicon-germanium layers 130 due to the difference in lattice constants between the two types of materials. The strain induced in silicon layers 120 may be a tensile strain, as the crystalline lattice structure of deposited or grown silicon may stretch to conform to the larger lattice structure of an underlying silicon-germanium layer 130. In exemplary embodiments, the strain induced in first material layers 120 may be oriented in at least two directions, such as along planar axes of a crystalline structure within first material layers 120. First material layers 120 and second material layers 130 may be formed, for example, by various epitaxial growth processes such as ultra-high vacuum chemical vapor deposition (UHV-CVD), low-pressure CVD (LPCVD), reduced-pressure CVD (RPCVD), rapid thermal CVD (RTCVD), or molecular beam epitaxy (MBE).

In one exemplary embodiment, a base layer 110 is provided above substrate 105 and below one of the first material layers 120 of the plurality of first material layers. Base layer 110 may include a third material that has a third lattice constant higher than the first lattice constant of first material layers 120, so that the third lattice constant being higher than the first lattice constant induces a strain in one first material layer 120 on base layer 110. For example, base layer 110 may be a silicon-germanium base layer provided over substrate 105 and first material layers 120 may be silicon layers, so that the silicon layer 120 provided on base layer 110 has a tensile strain induced in the silicon layer. Base layer 110 may be formed, for example, by various epitaxial growth processes such as ultra-high vacuum chemical vapor deposition (UHV-CVD), low-pressure CVD (LPCVD), reduced-pressure CVD (RPCVD), rapid thermal CVD (RTCVD), or molecular beam epitaxy (MBE). Base layer 110 may be formed to a desired thickness to, in one example, ensure that first material layers 120 and second material layers 130 are sufficiently separated from substrate 105 so that nanowire stacks subsequently formed from first material layers 120 and second material layers 130 may be similarly separated from substrate 105. In exemplary embodiments, a thickness of base layer 110 may be controlled so that the thickness does not exceed a metastable thickness greater than which defects in lattice structure of the material may be highly likely to form. For example, a base layer 110 of silicon-germanium may have a thickness between 10 nm and 100 nm, depending on the ratio of germanium to silicon in base layer 110. Providing a defect-free base layer 110 may ensure that a first material layer 120 epitaxially grown on base layer 110 may also be formed without defects in the strained lattice structure of the first material layer 120.

As FIG. 1A illustrates, a patterning layer 150, such as a masking layer or resist layer, may also be provided over the first material layers 120 and second material layers 130. Patterning layer 150 may be used to pattern trenches to be formed through first material layers 120 and second material layers 130, as further illustrated in FIG. 1B. FIG. 1B depicts structure 100 of FIG. 1A following removal of portions of first material layers 120 and second material layers 130, for example by etching through portions of patterning layer 150 and first material layers 120 and second material layers 130. The removal of portions of first material layers 120 and second material layers 130 results in formation of a plurality of nanowire stacks 115 that include first material nanowires 125 and second material nanowires 135. In exemplary embodiments in which the strain induced in first material layers 120 is oriented in at least two directions, removing portions of first material layers 120 and second material layers 130 to form the plurality of nanowire stacks 115 may substantially confine the strain in first material nanowires 125 to one direction along the lengths of the first material nanowires 125. The removing may be configured to form first material nanowires (and second material nanowires) with thicknesses on the order of a few nanometers or less (e.g., about ten nanometers or less), as depicted in FIG. 1B, that may retain the strain of the original first material layers 120 along the lengths of the first material nanowires 125 but that may not fully retain the strain across the cross-sectional profile of the nanowires 125. Substantially confining strain in the first material nanowires 125 may advantageously boost the mobility of charge carriers within first material nanowires 125.

FIG. 1C depicts an isometric view of a portion of structure 100 of FIG. 1B including substrate 105, base layer 110, and nanowire stacks 115 supported at opposite ends by first and second supports 140. First and second supports 140 may be provided at opposite ends of nanowire stacks 115 to support the nanowire stacks during subsequent processing, as described further herein. First and second supports 140 may, for example, be formed prior to providing first material layers 120 and second material layers 130 over substrate 105, so that first and second supports 140 remain in place during subsequent processing to support nanowire stacks 115. In alternative embodiments, nanowire stacks 115 may be supported by temporary support structures during subsequent processing, so that first and second supports 140 may be provided at a later processing stage after such temporary support structures have been removed. First and second supports 140 may, in exemplary embodiments, contact substrate 105 through base layer 110. In exemplary embodiments, first and second supports 140 may be source and drain regions of circuit structures, such as pFET nanowire structures or nFET nanowire structures as described herein.

FIG. 1D depicts structure 100 of FIGS. 1B and 1C following provision of a masking material 151 over nanowire stacks 115, leaving exposed one or more portions of base layer 110. Masking material 151 may, for example, be a spacer material such as silicon nitride. Masking material may, in one exemplary embodiment, be deposited over the plurality of nanowire stacks 115 and base layer 110 and subsequently recessed from over base layer 110 so that one or more portions of base layer 110 are left exposed. In one embodiment, masking material 151 may include at least a portion of the masking material 150 initially provided over the first material layers 120 and second material layers 130 (as shown in FIG. 1A). FIG. 1E depicts structure 100 of FIG. 1D following removal of base layer 110 from above the substrate. Removal of base layer 110 may, in exemplary embodiments, include exposing base layer 110 to an etchant via the exposed portions of the upper surface of base layer 110, during which masking material 151 prevents etching of the nanowire stacks 115. As described above, nanowire stacks 115 may be supported by first and second supports 140 (not depicted in FIG. 1E) at opposing ends of first material nanowires 125 and second material nanowires 135, so that nanowire stacks 115 do not collapse or break as a result of removing base layer 110. FIG. 1F depicts the structure 100 of FIG. 1E following removal of masking material 151, leaving the plurality of nanowire stacks 115 in place over substrate 105.

FIGS. 1G-1I depict structure 100 through one embodiment of a process for removing first material nanowires 125 from at least one nanowire stack 115a. FIG. 1G depicts structure 100 following provision of a masking material 152 over the at least one nanowire stack 115a and at least one other nanowire stack 115b. As substrate 105 may be exposed, masking material 152 may also be provided over substrate 105. Masking material 152 may, in one example, be a hard-mask material such as silicon nitride. Masking material 152 may be provided by any process that ensures the masking material 152 will cover nanowire stacks 115 at the tops, sides, and bottoms of said nanowire stacks, such as by a flowable chemical-vapor deposition (FCVD) process.

FIG. 1H depicts structure 100 following provision of a resist material 160 over the at least one other nanowire stack 115b. Resist material 160 may, for example, be provided so that resist material 160 covers the at least one other nanowire stack 115b without covering the at least one nanowire stack 115a. In another example, resist material 160 may be provided over the plurality of nanowire stacks 115 and etched back or recessed from over the at least one nanowire stack 115a without being removed from over the at least one other nanowire stack 115b. FIG. 1H also depicts structure 100 following preferential removal of masking material 152 from over the at least one nanowire stack 115a, exposing first material nanowires 125 and second material nanowires 135 in said nanowire stack 115a. Resist material 160 prevents the removal of the masking material 152 from over the at least one other nanowire stack 115b. For example, masking material 152 may be a hard-mask material, such as silicon nitride, resist material 160 may be an organic material layer, and masking material 152 may be exposed to an etchant, such as hot phosphoric acid in one example, that preferentially removes silicon nitride without also removing organic materials such as resist layer 160.

FIG. 1I depicts structure 100 following removal of resist layer 160 from over the at least one other nanowire stack 115b and following removal of first material nanowires 125 from the at least one nanowire stack 115a. In one exemplary embodiment, first material nanowires 125 may be removed from at least one nanowire stack 115a by thermally oxidizing the first material of the first material nanowires 125 and preferentially removing the oxidized first material from the at least one nanowire stack 115a. For example, first material nanowires 125 may be silicon nanowires, so that thermal oxidation of the at least one nanowire stack oxidizes first material nanowires 125 into silicon dioxide, which may be removed, for example by an etchant such as hydrofluoric acid (HF), without affecting masking material 152 protecting at least one other nanowire stack 115b.

In one exemplary embodiment, second material nanowires 135 may include a compound including a first element and a second element, such as silicon and germanium (SiGe), with the first element being the same as the first material in first material nanowires 125. Thermally oxidizing the first material nanowires 125 may further oxidize the first element in second material nanowires 135. The oxidation conditions, such as the thermal oxidation temperature, may be controlled to preferentially oxidize the first element in second material nanowires 135 and minimize oxidation of the second element in second material nanowires. In one example, the thermal oxidation temperature may be maintained between about 500° C. and about 1200° C. In one exemplary embodiment, first material nanowires 125 may be silicon nanowires, second material nanowires 135 may be silicon-germanium nanowires, so that thermal oxidation of the silicon nanowires also oxidizes the silicon in the silicon-germanium nanowires. The oxidation of the first element of the second material nanowires 135 may occur at outer surfaces of second material nanowires 135, and the oxidation may also penetrate further below the outer surfaces of second material nanowires. The same process that preferentially removes oxidized first material nanowires 125 may also remove the oxidized first element from second material nanowires, increasing a concentration of the second element in second material nanowires 135. In the example embodiments above, as silicon nanowires 125 are subjected to thermal oxidation the silicon-germanium nanowires 135 may also be subjected to thermal oxidation, resulting in the silicon of the silicon-germanium being preferentially oxidized and forming an outer layer of silicon-dioxide on the silicon-germanium nanowires. Subsequently, as the oxidized silicon nanowires are removed, the silicon dioxide on the outer layers of the silicon-germanium nanowires is also preferentially removed, leaving behind silicon-germanium nanowires with an increased concentration of germanium. In an extreme embodiment, the silicon in silicon-germanium nanowires 135 may be completely oxidized and removed, leaving behind pure germanium nanowires 135.

FIGS. 1J-1L depict structure 100 through one embodiment of a process for removing second material nanowires 135 from at least one other nanowire stack 115b. FIG. 1J depicts structure 100 following provision of a masking material 153 over the at least one other nanowire stack 115b and at least one nanowire stack 115a. As substrate 105 may be exposed, masking material 153 may also be provided over substrate 105. Masking material 153 may, in one example, be a hard-mask material such as silicon nitride. Masking material 153 may be provided by any process that ensures the masking material 153 will cover nanowire stacks 115 at the tops, sides, and bottoms of said nanowire stacks, such as by a flowable chemical-vapor deposition (FCVD) process.

FIG. 1K depicts structure 100 following provision of a resist material 165 over the at least one nanowire stack 115*a*. Resist material 165 may, for example, be provided so that resist material 165 covers the at least one nanowire stack 115*a* without covering the at least one other nanowire stack 115*b*. In another example, resist material 165 may be provided over the plurality of nanowire stacks 115 and etched back or recessed from over the at least one other nanowire stack 115*b* without being removed from over the at least one nanowire stack 115*a*. FIG. 1K also depicts structure 100 following preferential removal of masking material 153 from over the at least one other nanowire stack 115*b*, exposing first material nanowires 125 and second material nanowires 135 in said nanowire stack 115*b*. Resist material 165 prevents the removal of the masking material 153 from over the at least one nanowire stack 115*a*. For example, masking material 153 may be a hard-mask material, such as silicon nitride, resist material 165 may be an organic material layer, and masking material 153 may be exposed to an etchant that preferentially removes silicon nitride without also removing organic materials such as resist layer 165.

FIG. 1L depicts structure 100 following removal of resist layer 165 from over the at least one nanowire stack 115*a* and following removal of second material nanowires 135 from the at least one other nanowire stack 115*b*. In one exemplary embodiment, second material nanowires 135 may be removed from at least one other nanowire stack 115*b* by exposing said nanowire stack 115*b* to an etchant that etches the second material of second material nanowires 135 without etching the first material of first material nanowires 125. For example, in embodiments in which first material nanowires 125 comprise silicon and second material nanowires 135 comprise silicon-germanium, a solution of nitric acid, acetic acid, and hydrofluoric acid ($HNO_3$:$CH_3COOH$:HF) may be used to preferentially remove the second material nanowires 135. The etchant that preferentially removes second material nanowires 135 also may not remove masking material 153 from over the at least one nanowire stack 115*a*.

It will be appreciated that in at least one embodiment the processes depicted in FIGS. 1G-1I and 1J-1L may be carried out in the order as described, and that in at least one alternative embodiment the order of the processes may be reversed, that is, the second material nanowires 135 may be removed from at least one of the other nanowire stacks 115*b* first, followed by removal of first material nanowires 125 from at least one nanowire stack 115*b*.

FIG. 1M depicts structure 100 following removal of masking material 153, with at least one nanowire stack 115*a* including nanowires 135 and at least one other nanowire stack 115*b* including nanowires 125. In exemplary embodiments, at least one nanowire stack 115*a* is a p-type nanowire stack (e.g., having enhanced hole mobility) and at least one other nanowire stack 115*b* is an n-type nanowire stack (e.g., having enhanced electron mobility). For example, nanowires 135 of the at least one nanowire stack 115*a* may be silicon-germanium nanowires having a high concentration of germanium, which may provide optimal hole mobility through the nanowires. In extreme instances, nanowires 135 may be pure germanium nanowires. As another example, nanowires 125 of at least one other nanowire stack 115*b* may be strained silicon nanowires, which may provide optimal electron mobility through the nanowires. The strain in nanowires 125 of at least one other nanowire stack 115*b* may, for instance, be substantially confined to one direction along the length of nanowires 125.

FIG. 1N provides an isometric view of structure 100 from FIG. 1M, showing a plurality of p-type nanowire stacks 115*a* and a plurality of n-type nanowire stacks 115*a* formed by at least one embodiment of the process described above. FIG. 1N also depicts first supports and second supports 140 supporting p-type nanowire stacks 115*a* and *n*-type nanowire stacks 115*b* at opposite ends of the nanowire stacks. First supports and second supports 140 may be source/drain regions of circuit structures, so that p-type nanowire stacks 115*a* combine with first and second supports 140 to form pFET circuit structures 180. Similarly, n-type nanowire stacks 115*b* may combine with first and second supports 140 to form nFET circuit structures 170 if first and second supports 140 are, for example, source/drain regions.

FIG. 1O depicts structure 100 of FIGS. 1M-1N following provision of a dielectric layer 190 over the substrate subsequent to removing the first material nanowires from the at least one nanowire stack 115*a* and removing the second material nanowires from the at least one other nanowire stack 115*b*. Dielectric layer 190 may be any suitable material such as silicon dioxide that may suitably insulate substrate 105 from nanowire stacks 115*a*, 115*b*.

As described, FIGS. 1A-1O depict one exemplary embodiment of a process for forming pFET and nFET nanowire circuit structures. In an exemplary alternative embodiment, the base layer 110 in FIGS. 1A-1D may be a dielectric material provided over substrate 105 and below first material layers 120 and second material layers 130. In such an alternative embodiment, base layer 110 may remain over substrate 105 without being removed as described above. Thus, for example, it may not be necessary to deposit the masking material 151 over nanowire stacks 115 as depicted in FIG. 1E as base layer 110, in this embodiment, is not exposed to an etchant for preferentially removing base layer 110. As well, deposition of dielectric layer 190 depicted in FIG. 1O may be unnecessary as base layer 110 provides the desired dielectric material layer for electrically isolating substrate 105 from nanowire stacks 115*a* and 115*b*. Aside from such differences, however, the process as described in the first embodiment above may be carried out with a dielectric base layer 110 that remains over substrate 105 rather than a base layer 110 that is removed before removing nanowires from nanowire stacks 115.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
providing a substrate;
providing a base layer above the substrate;
providing first material layers and second material layers above the base layer, the first material layers interleaved with the second material layers, wherein the first material layers have a first lattice constant and the second material layers have a second lattice constant, the second lattice constant being higher than the first lattice constant, and wherein the base layer comprises a third material having a third lattice constant higher than the first lattice constant, wherein one first material layer of the first material layers is provided on the base layer, and the third lattice constant being higher than the first lattice constant inducing a strain in the one first material layer on the base layer;
removing portions of the first material layers and second material layers, the removing forming a plurality of nanowire stacks comprising first material nanowires and second material nanowires;
removing the entire base layer from above the substrate, the removing the base layer comprising providing a masking material over the plurality of nanowire stacks and leaving exposed one or more portions of the base layer, and etching the exposed portions of the upper surface of the base layer, the etching resulting in removal of the base layer entirely under the plurality of nanowire stacks, the masking material preventing etching of the plurality of nanowire stacks;
removing the first material nanowires from at least one nanowire stack of the plurality of nanowire stacks; and
removing the second material nanowires from at least one other nanowire stack of the plurality of nanowire stacks;
wherein the at least one nanowire stack and at least one other nanowire stack comprise at least one p-type nanowire stack and at least one n-type nanowire stack, respectively.

2. The method of claim 1, wherein the second lattice constant being higher than the first lattice constant induces a strain in at least the first material layers.

3. The method of claim 2, wherein the strain induced in the first material layers is oriented in at least two directions, and wherein the removing to form a plurality of nanowire stacks substantially confines the strain in the first material nanowires to one direction along lengths of the first material nanowires.

4. The method of claim 1, wherein the first material layers comprise silicon and the second material layers comprise silicon-germanium.

5. The method of claim 1, wherein the base layer comprises silicon-germanium and the first material layer comprises silicon.

6. The method of claim 1, further comprising providing a dielectric layer over the substrate subsequent to removing the first material nanowires from the at least one nanowire stack and subsequent to removing the second material nanowires from the at least one other nanowire stack.

7. The method of claim 1, wherein removing the first material nanowires from the at least one nanowire stack comprises thermally oxidizing the first material of the first material nanowires and preferentially removing the oxidized first material.

8. The method of claim 7, wherein the second material of the second material nanowires comprises a compound of at least a first element and a second element, the first element being the same as the first material of the first material nanowires, and the thermally oxidizing further preferentially oxidizes the first element of the second material nanowires, thereby facilitating increasing a concentration of the second element in the second material nanowires.

9. The method of claim 8, wherein the first material is silicon, the first element of the second material is silicon, and the second element of the second material is germanium.

10. The method of claim 7, further comprising:
providing the masking material over the at least one nanowire stack and the at least one other nanowire stack;
providing a resist material over the at least one other nanowire stack and the masking material over the at least one other nanowire stack; and
preferentially removing the masking material from over the at least one nanowire stack prior to removing the first material nanowires thereof, the resist material preventing removal of the masking material from over the at least one other nanowire stack.

11. The method of claim 10, wherein the masking material comprises a nitride material and the resist material comprises an organic material, and wherein preferentially removing the masking material from over the at least one nanowire stack comprises exposing the masking material to an etchant that preferentially etches the nitride material.

12. The method of claim 1, wherein removing the second material nanowires from the at least one other nanowire stack comprises exposing the at least one other nanowire stack to an etchant, the etchant etching the second material of the second material nanowires from the at least one other nanowire stack without etching the first material of the first material nanowires.

13. The method of claim 12, further comprising:
providing the masking material over the at least one nanowire stack and at least one other nanowire stack;
providing a resist material over the at least one nanowire stack and the masking material over the at least one nanowire stack; and
preferentially removing the masking material from over the at least one other nanowire stack prior to removing the second material nanowires thereof, the resist material preventing removal of the masking material from over the at least one nanowire stack.

14. The method of claim 13, wherein the masking material comprises a nitride material and the resist material comprises an organic material, and wherein preferentially removing the masking material from over the at least one other nanowire stack comprises exposing the nitride material to an etchant that preferentially etches the nitride material.

15. The method of claim 1, further comprising providing an additional base layer above the substrate and below the first material layers and second material layers, the additional base layer comprising a dielectric material remaining over the substrate without removal.

16. The method of claim 1, further comprising providing first supports and second supports at opposite ends of the plurality of nanowire stacks to support the first material nanowires of the at least one nanowire stack following removal of the second material nanowires therefrom, and to support the second material nanowires of the at least one other nanowire stack following removal of the first material nanowires therefrom.

17. The method of claim 16, wherein the first supports and second supports comprise source/drain regions of circuit structures, and wherein the p-type nanowire stack combines with one first support and one second support to form a pFET circuit structure, and the n-type nanowire stack combines with another first support and another second support to form a nFET circuit structure.

\* \* \* \* \*